United States Patent
Lin et al.

(10) Patent No.: US 6,423,618 B1
(45) Date of Patent: Jul. 23, 2002

(54) METHOD OF MANUFACTURING TRENCH GATE STRUCTURE

(75) Inventors: Ming-Jang Lin, Taichung Hsien; Chorng-Wei Liaw, Yun-Lin Hsien; Tian-Fure Shiue, Hsinchu Hsien; Ching-Hsiang Hsu, Hsinchu; Huang-Chung Cheng, Tainan, all of (TW)

(73) Assignee: Analog and Power Electronics Corp., Hsinchu (TW)

( * ) Notice: Subject to any disclaimer, the term of this patent is extended or adjusted under 35 U.S.C. 154(b) by 0 days.

(21) Appl. No.: 09/461,869

(22) Filed: Dec. 15, 1999

(51) Int. Cl.⁷ .............................................. H01L 21/302
(52) U.S. Cl. ...................... 438/589; 438/751; 438/723; 438/724; 438/719; 438/692; 438/753; 438/756; 438/757; 438/734
(58) Field of Search ................................. 438/589, 723, 438/719, 724, 692, 753, 756, 757, 751, 734

(56) References Cited

U.S. PATENT DOCUMENTS

| | | | |
|---|---|---|---|
| 4,992,390 A | * | 2/1991 | Chang .......................... 437/42 |
| 5,146,426 A | * | 9/1992 | Mukherjee et al. .......... 365/149 |
| 5,164,325 A | * | 11/1992 | Cogan et al. .................. 437/29 |
| 5,242,845 A | * | 9/1993 | Baba et al. .................... 437/40 |
| 5,300,450 A | * | 4/1994 | Shen et al. .................... 437/52 |
| 5,801,417 A | * | 9/1998 | Tsang et al. .................. 257/333 |
| 6,015,737 A | * | 1/2000 | Tokura et al. ................ 438/270 |
| 6,100,146 A | * | 8/2000 | Gardner et al. .............. 438/301 |
| 6,117,734 A | * | 9/2000 | Nakamura .................... 438/268 |
| 6,159,801 A | * | 12/2000 | Hsieh et al. .................. 438/259 |
| 6,198,127 B1 | * | 3/2001 | Kocon .......................... 257/328 |
| 6,261,902 B1 | * | 7/2001 | Park et al. .................... 438/257 |

FOREIGN PATENT DOCUMENTS

| | | | |
|---|---|---|---|
| JP | 06-021389 | * | 1/1994 |
| JP | 11-068102 | * | 3/1999 |
| WO | 00/72372 | * | 11/2000 |

* cited by examiner

*Primary Examiner*—George Goudreau
(74) *Attorney, Agent, or Firm*—J.C. Patents

(57) ABSTRACT

A method for manufacturing a trench gate structure of a power metal-oxide-semiconductor field-effect transistor. A substrate is provided, which substrate has a epitaxial layer thereon, a base region formed in the epitaxial layer, a source region formed in a portion of the base region, a first dielectric layer on the base region and the source region, a second dielectric layer on the first dielectric layer and a trench penetrating through the second and the first dielectric layers, the source region and the base region and into the epitaxial layer. A third dielectric layer is formed on the bottom of the trench. A conformal gate oxide layer is formed in the trench. A conformal polysilicon layer is formed on the second dielectric layer and in the trench. A fourth dielectric layer is formed on the polysilicon layer to fill the trench. Portions of the fourth dielectric layer and the polysilicon layer are removed until the surfaces of the fourth dielectric layer and the polysilicon layer are substantially level with the surface of the base region.

24 Claims, 9 Drawing Sheets

METHOD OF MANUFACTURING TRENCH GATE STRUCTURE

BACKGROUND OF THE INVENTION

1. Field of the Invention

The present invention in general relates to a method of manufacturing a power metal-oxide-semiconductor field-effect transistor (MOSFET). In particular, the present invention relates to a method of manufacturing a trench power MOSFET and more particularly, to a method of manufacturing a trench gate structure of a trench power MOSFET.

2. Description of the Related Art

Currently, a power metal-oxide-semiconductor field-effect transistor (MOSFET) can be a high voltage device, and it can be operated at a voltage higher than 4500 volts. The conventional method for fabricating the power MOSFET is similar to the method for manufacturing a common semiconductor device. The gate structure of the power MOSFET is formed on the surface of the substrate, which is called a planar-gate structure. However, the method of fabricating the planar-gate structure may limit size reduction of the poly gate length and lead to a low cell packing density. Consequently, the fabrication of a trench power MOSFET, which can greatly reduce the size of the device, is the trend of the power device industry. The method of manufacturing a trench, double diffused MOS is disclosed in U.S. Pat. No. 5,567,634. FIGS. 1A through 1E are schematic, cross-sectional views of the conventional process for manufacturing a trench gate structure of a trench power MOSFET.

As shown in FIG. 1A, a substrate 100 having an N-type epitaxial layer 101 thereon is provided. A silicon dioxide layer 102 is formed on the N-type epitaxial layer 101. A silicon nitride layer 103 is formed on the silicon dioxide layer 102. A silicon dioxide layer 104 is formed on the silicon nitride layer 103.

As shown in FIG. 1B, a trench 105 is formed to penetrate through the silicon dioxide layer 104, the silicon nitride layer 103 and the oxide layer 102 and into the epitaxial layer 101. The oxide layer 104 is removed. A sacrificial oxide layer (not shown) is grown and then removed, which sacrificial oxide layer is used to restore the defects of the trench 105. A gate oxide layer 106 is formed and is conformal to the trench 105. A polysilicon layer 107 is formed over the substrate 100 and fills the trench 105.

As shown in FIG. 1C, portions of the polysilicon layer 107 are removed to expose the surface of the silicon nitride layer 103, and the surface of the remaining polysilicon layer 107a in the trench 105 is substantially level with the top surface of the silicon nitride layer 103.

As shown in FIG. 1D, a portion of the polysilicon layer 107a is converted into a silicon dioxide layer 108. The silicon nitride layer 103 is removed.

As shown in FIG. 1E, a P-type base region 109 is formed from the surface of the epitaxial layer 101. An N$^+$-type source region 110 is formed adjacent to the trench 105 in the P-type base region 109. A spacer 111 is formed on the sidewall of the polysilicon layer 107a and the silicon dioxide layer 108. A P$^+$-type base ohmic contact 112 is formed on the side of the N$^+$-type source region 110. An aluminum film 113 is formed to cover the substrate 100.

According to the above-mentioned method, the gate oxide layer on the bottom of the trench is thinner than the gate oxide layer on the sidewall of the trench, so the breakdown voltage of the gate oxide layer is decreased and the leakage current is increased. Furthermore, the accumulation of electrons at the bottom corner of the trench easily results in leakage current problems.

SUMMARY OF THE INVENTION

It is therefore an object of the present invention to provide a method for manufacturing a trench power MOSFET. In one aspect of the present invention, the ability of the devices to resist the breakdown voltage is greatly enhanced and the problem of leakage can be overcome. Moreover, the capacitance between the gate structure and the drift region is decreased. Hence, the switching speed of the device is increased and the switching power loss is reduced.

To achieve these and other advantages and in accordance with the purpose of the present invention, as embodied and broadly described herein, this invention provides a method for manufacturing a trench gate structure of a power metal-oxide-semiconductor field-effect transistor, which is formed on a substrate having a epitaxial layer thereon, a base region formed in the epitaxial layer, a source region formed in a portion of the base region, a first dielectric layer on the base region and the source region, and a second dielectric layer on. the first dielectric layer. Furthermore, a trench penetrates through the second and the first dielectric layers, the source region and the base region and into the epitaxial layer. A third dielectric layer is formed on the bottom of the trench. A conformal gate oxide layer is formed in the trench. A conformal polysilicon layer is formed on the second dielectric layer and in the trench. A fourth dielectric layer is formed on the polysilicon layer to fill the trench. Portions of the fourth dielectric layer and the polysilicon layer are removed until the surfaces of the fourth dielectric layer and the polysilicon layer are substantially level with the surface of the base region.

A method for manufacturing a trench gate structure of a power metal-oxide-semiconductor field-effect transistor is suitable for formation on a substrate having a epitaxial layer thereon, a base region formed in the epitaxial layer, a source region formed in a portion of the base region, a first dielectric layer on the base region and the source region, a second dielectric layer on the first dielectric layer and a trench penetrating through the second and the first dielectric layers, the source region and the base region and into the epitaxial layer. A third dielectric layer is formed on the bottom of the trench. The second dielectric layer is removed. A conformal gate oxide layer is formed in the trench. A conformal polysilicon layer is formed on the first dielectric layer and in the trench. A fourth dielectric layer is formed on the polysilicon layer to fill the trench. The fourth dielectric layer and the polysilicon layer are patterned so that the remaining fourth dielectric layer and polysilicon layer extending on the first dielectric layer are wider than the trench.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
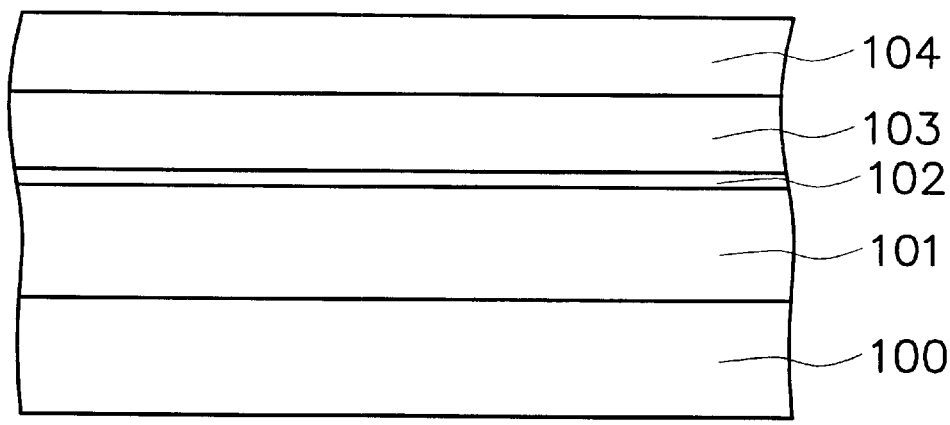
FIGS. 1A through 1E are schematic, cross-sectional views of the conventional process for manufacturing a trench gate structure of a power MOSFET.
Figure 1B:
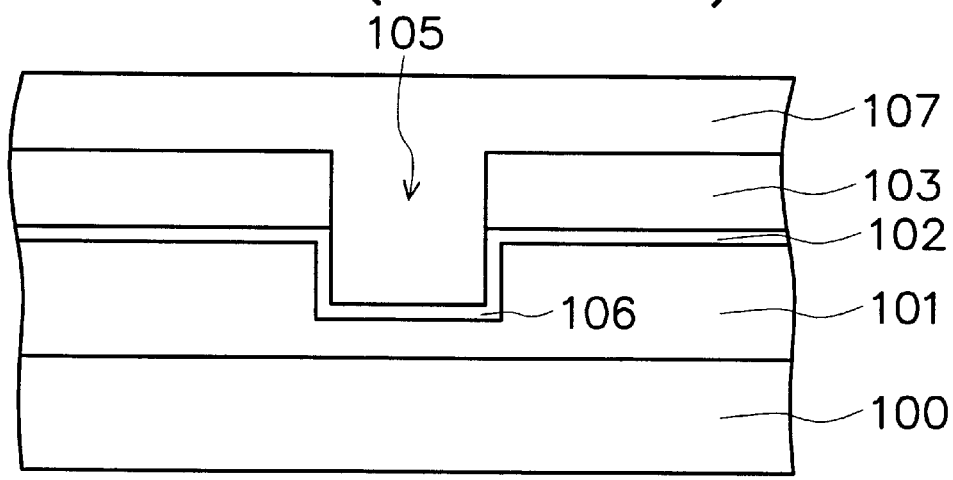
Figure 1C:
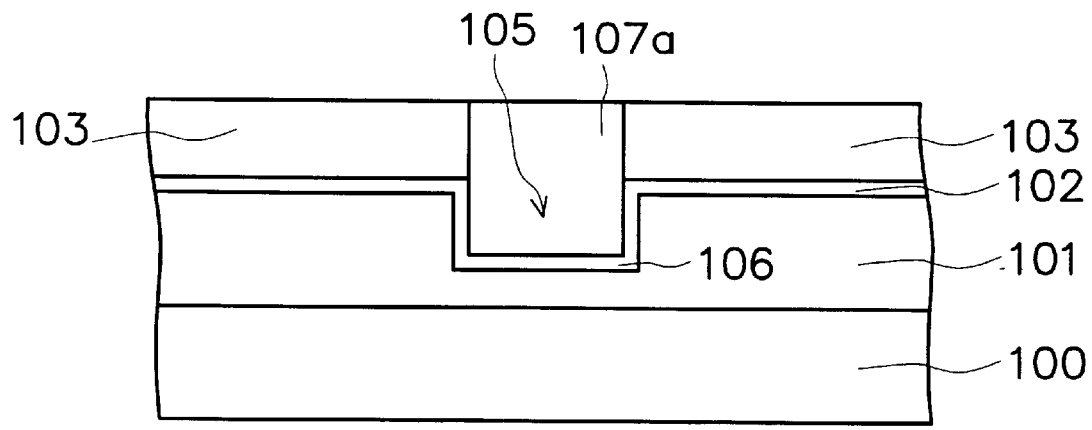
Figure 1D:
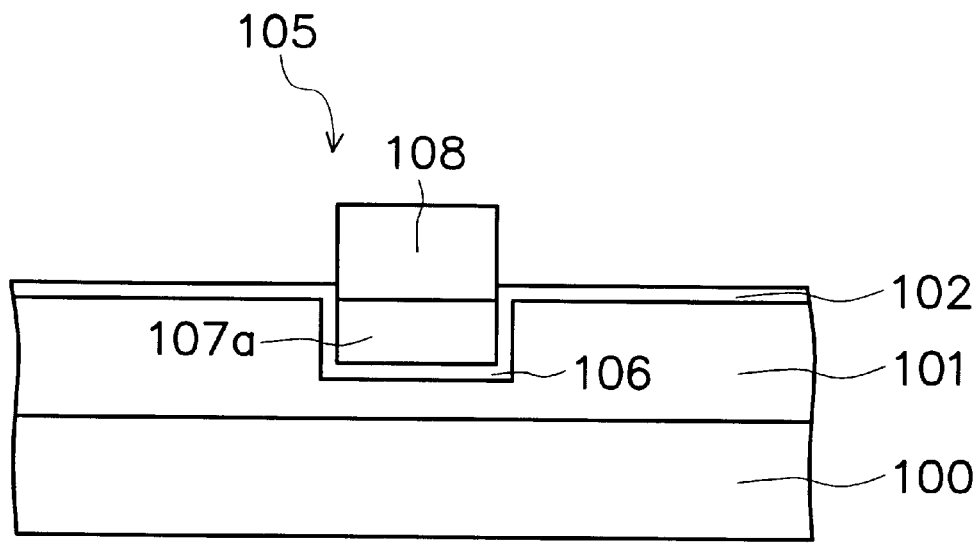
Figure 1E:
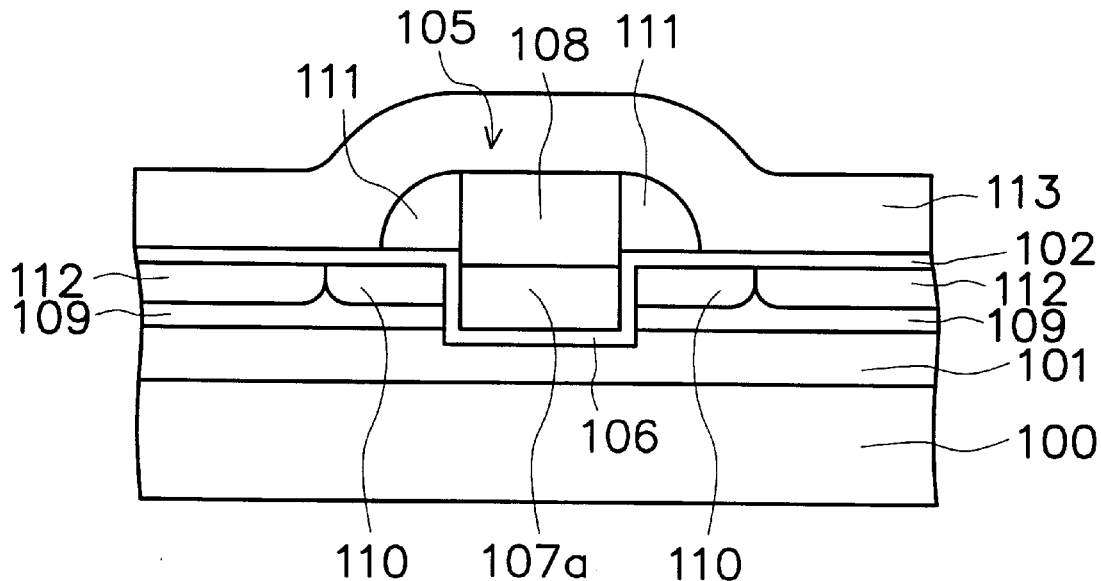

Reference will now be made in detail to the present preferred embodiments of the invention, examples of which are illustrated in the accompanying drawings. Wherever possible, the same reference numbers are used in the drawings and the description to refer to the same or like parts.

Figure 2A:
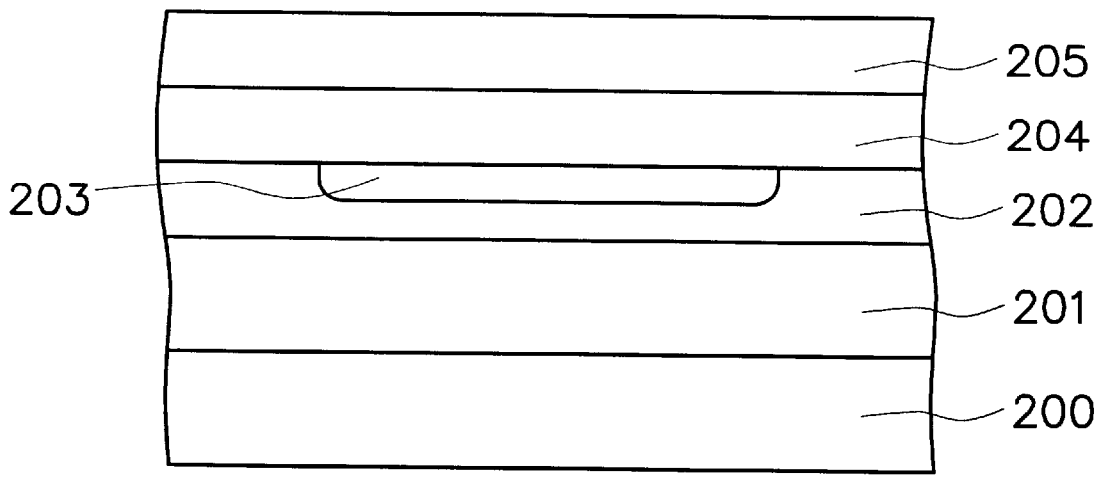
FIGS. 2A through 2F are schematic, cross-sectional views of the process for manufacturing a trench gate structure of a power MOSFET in a preferred embodiment according to the invention.

FIGS. 2A through 2F are schematic, cross-sectional views of the process for manufacturing a trench gate structure of a power MOSFET in a preferred embodiment according to the invention. As shown in FIG. 2A, a substrate 200 having an epitaxial layer 201 thereon is provided. The epitaxial layer 201 can be an $N^-$-type epitaxial silicon layer formed by chemical vapor deposition (CVD), for example. A conductive base region 202 is formed from the surface of the epitaxial layer 201. The conductive type of the conductive base region 202 can be P-type, for example. In this example, the method of forming the conductive base region 202 comprises the steps of ion implantation and thermal drive-in. The ions used in the ion implantation step include boron ions, for example. A conductive source region 203 is formed from the surface of the conductive base region 202 into the conductive base region 202. The conductive type of the conductive source region 203 can be $N^+$-type, for example. In this example, the method of forming the conductive source region 203 comprises the steps of ion implantation and thermal drive-in. The ions used in the ion implantation step include arsenic ions, for example. A dielectric layer 204 is formed over the substrate 200. The dielectric layer 204 can be a silicon dioxide layer formed by thermal oxidation, low-pressure chemical vapor deposition (LPCVD) or plasma enhanced chemical vapor deposition (PECVD), for example. A dielectric layer 205 is formed on the dielectric layer 204. The dielectric layer 205 is used as a hard mask and it can be a silicon nitride layer formed by LPCVD, for example.

Figure 2B:
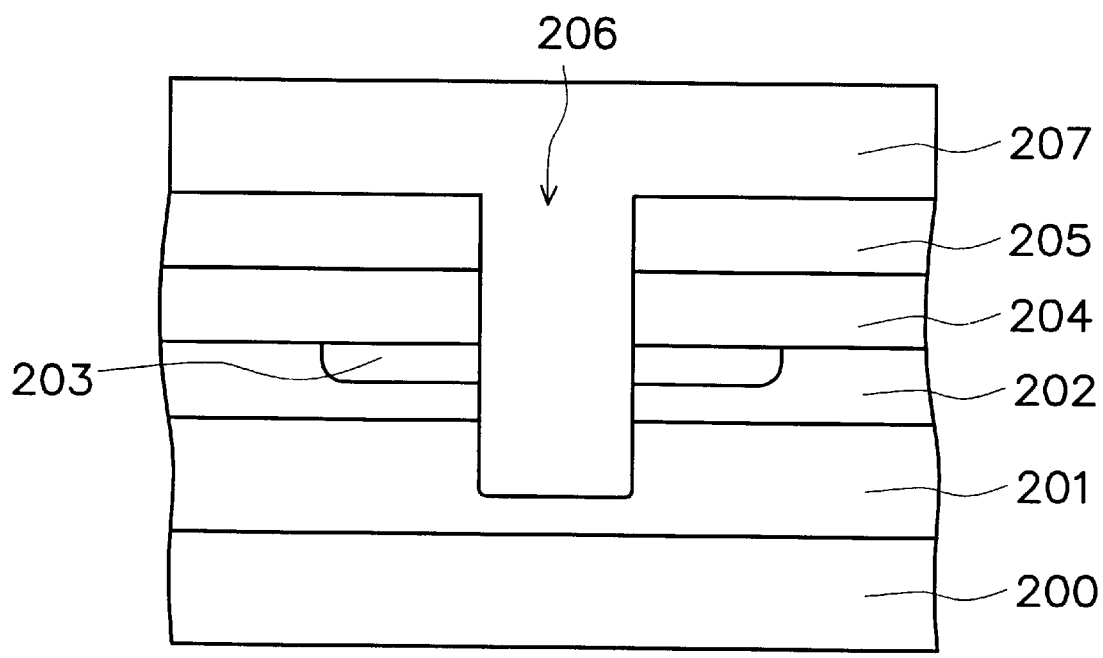

As shown in FIG. 2B, a trench 206 is formed to penetrate the dielectric layers 205 and 204, the conductive source region 203 and the conductive base region 202 and into the epitaxial layer 201. A dielectric layer 207 is formed on the dielectric layer 205 and fills the trench 206. The dielectric layer 207 can be a silicon dioxide layer formed by CVD, for example. The CVD process is for example LPCVD, PECVD, electron cyclotron resonance (ECR) CVD, inductively coupled plasma (ICP) CVD and high-density plasma (HDP) CVD.

Figure 2C:
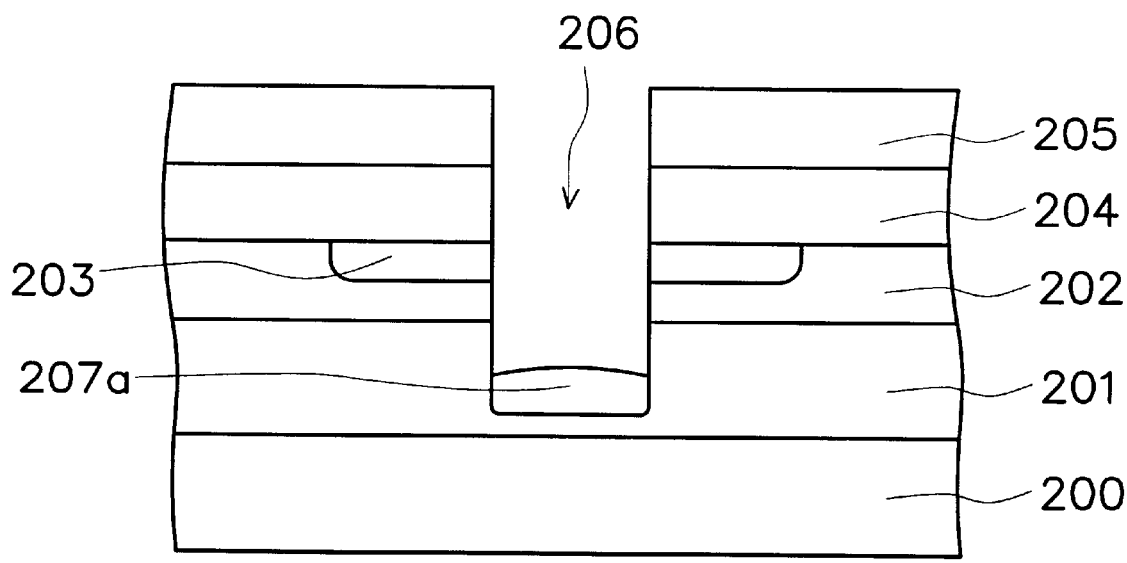

As shown in FIG. 2C, a dielectric layer 207a is formed on the bottom surface of the trench 206 by removing portions of the dielectric layer 207. The method of removing the portions of the dielectric layer 207 can be dry etching or wet etching, for example.

Figure 2D:
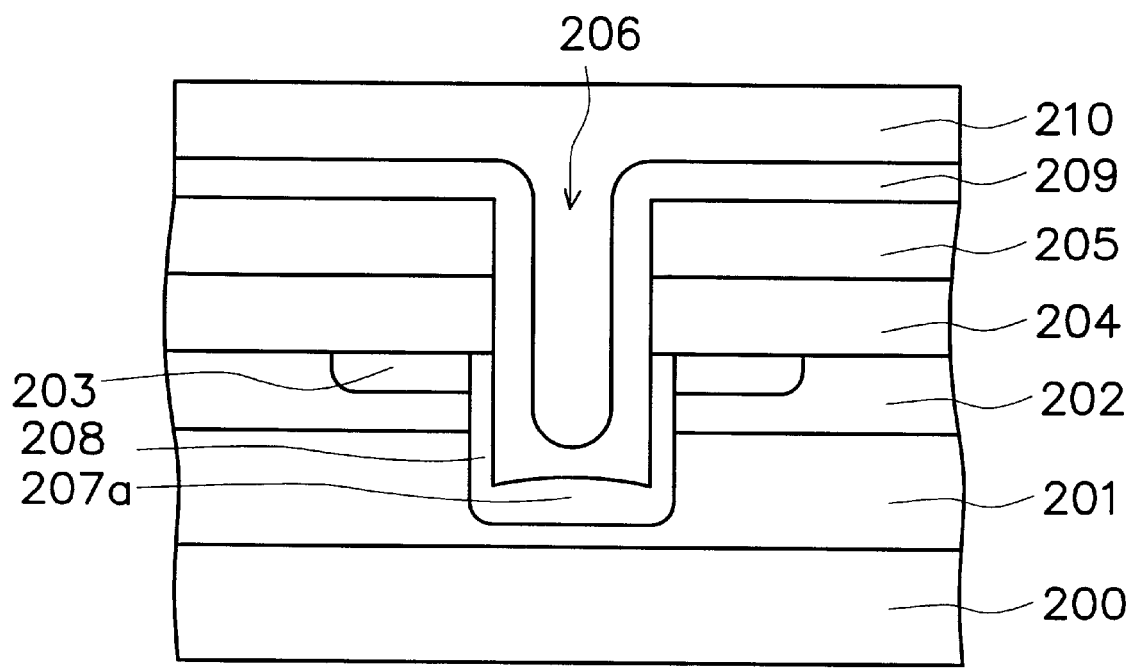

As shown in FIG. 2D, a sacrificial oxide layer (not shown) is grown in the trench 206 and is used to restore the trench 206. The method of forming the sacrificial oxide layer can be thermal oxidation, for example. The sacrificial oxide layer is removed. The method of removing the sacrificial oxide layer can be wet etching, for example. A gate oxide layer 208 is conformally formed in the trench 206. The method of forming the gate oxide layer 208 can be thermal oxidation, for example. A polysilicon layer 209 is conformally formed on the dielectric layer 205 and in the trench 206. The method of forming the polysilicon layer 209 can be LPCVD, for example. A dielectric layer 210 is formed on the polysilicon layer 209 and fills the trench 206. The dielectric layer 210 can be a silicon dioxide layer formed by LPCVD or thermal oxidation, for example.

Figure 2E:
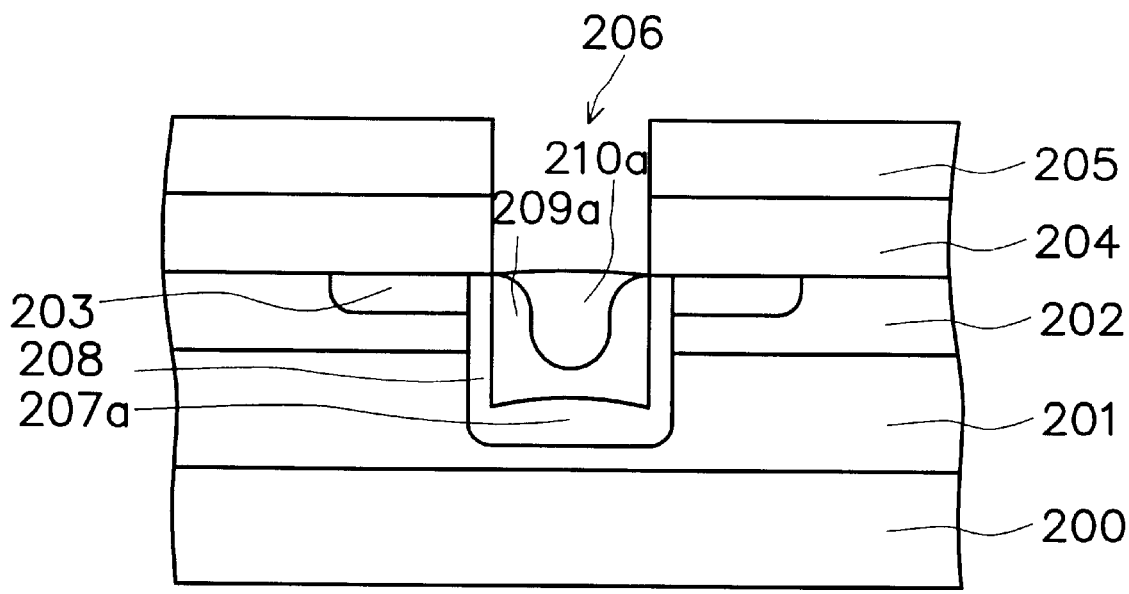

As shown in FIG. 2E, portions of the dielectric layer 210 and the polysilicon layer 209 are removed to form a polysilicon layer 209a and a dielectric layer 210a. The surfaces the polysilicon layer 209a and the dielectric layer 210a are substantially level with the surface of the conductive base region 202. The polysilicon layer 209a is on the sidewall and the bottom of the trench 206 and the dielectric layer 210a fills the recess within the polysilicon layer 209a in the trench 206. The method of forming the polysilicon layer 209a and the dielectric layer 210a can be etching back or the method coordinating chemical-mechanical polishing with etching back, for example. The structure composed by the polysilicon layer 209a and the dielectric layer 210a is used as the trench gate structure of the device.

Figure 2F:
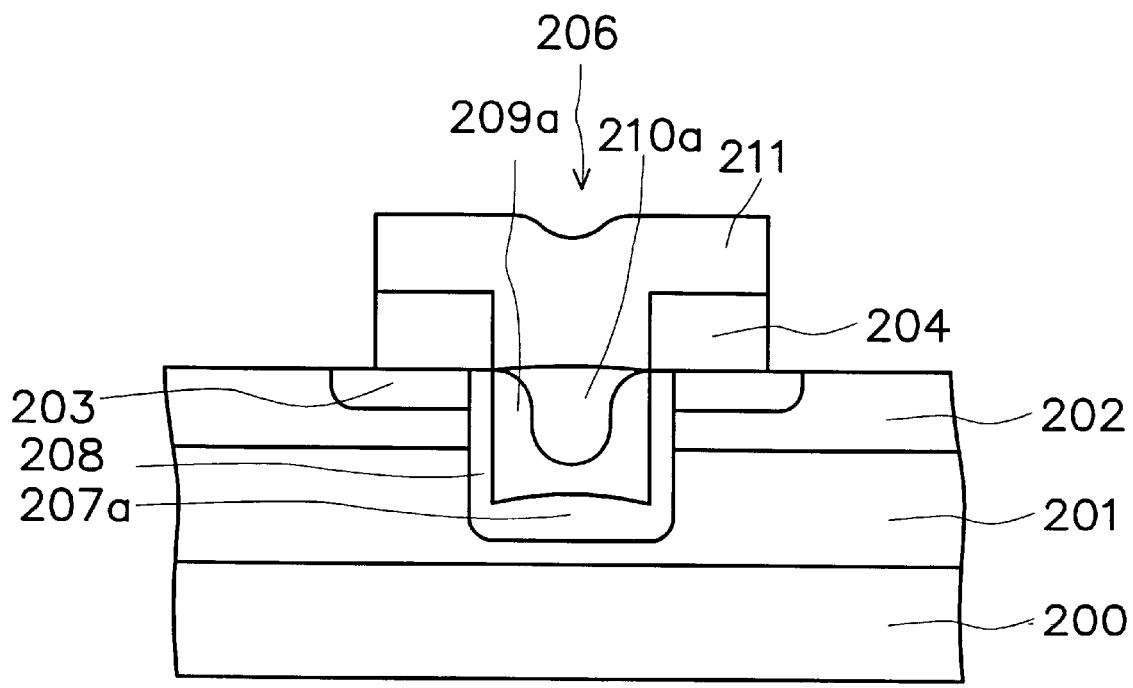

As shown in FIG. 2F, the dielectric layer 205 is removed to expose the dielectric layer 204. The method of removing the dielectric layer 205 can be wet etching with heated phosphoric acid, for example. A dielectric layer 211 is formed on the dielectric layer 204 and in the trench 206 and fills the trench 206. The dielectric layer 211 can be a borophosphosilicate glass (BPSG) layer formed by LPCVD. The dielectric layers 211 and 204 are patterned to expose portions of the conductive base region 202 and the conductive source region 203. In the subsequent steps, conventional processing techniques, which are well known to those skilled in the art, are used to form the base ohmic contact and the wires.

Figure 3A:
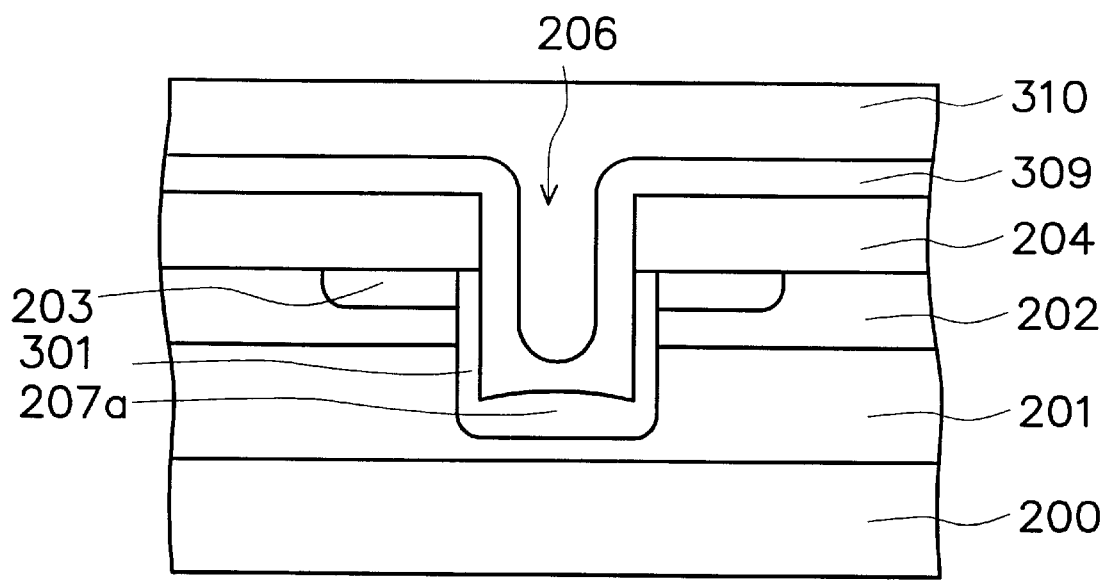
FIGS. 3A through 3C are schematic, cross-sectional views of the process for manufacturing a trench gate structure of a power MOSFET in a second preferred embodiment according to the invention.
Figure 3B:
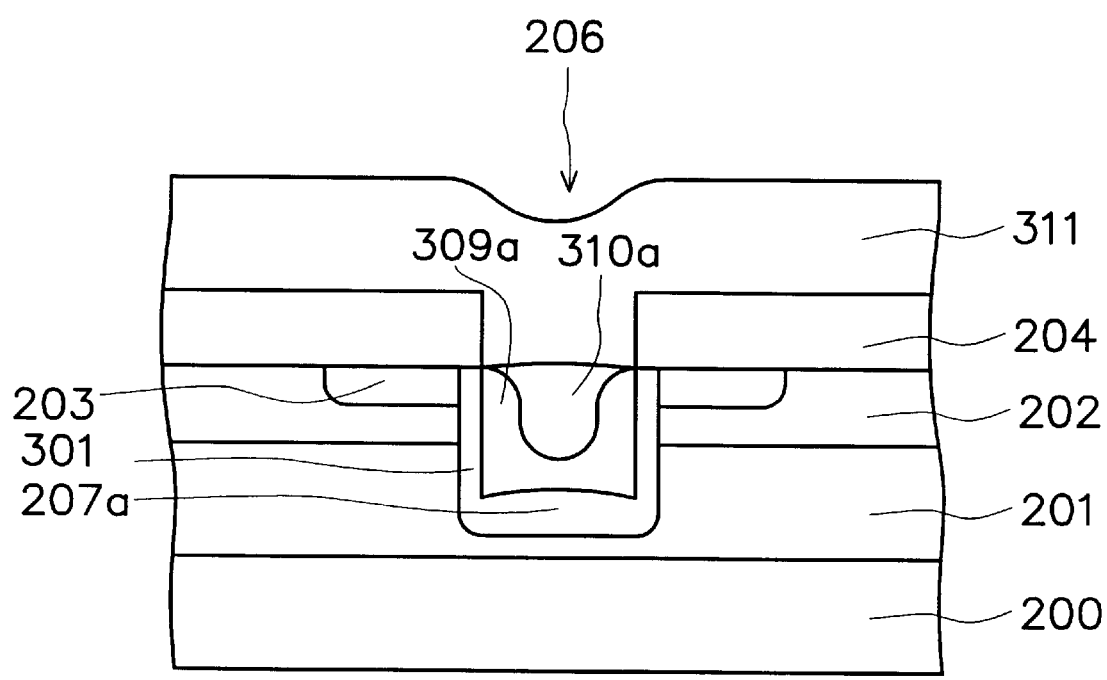
Figure 3C:
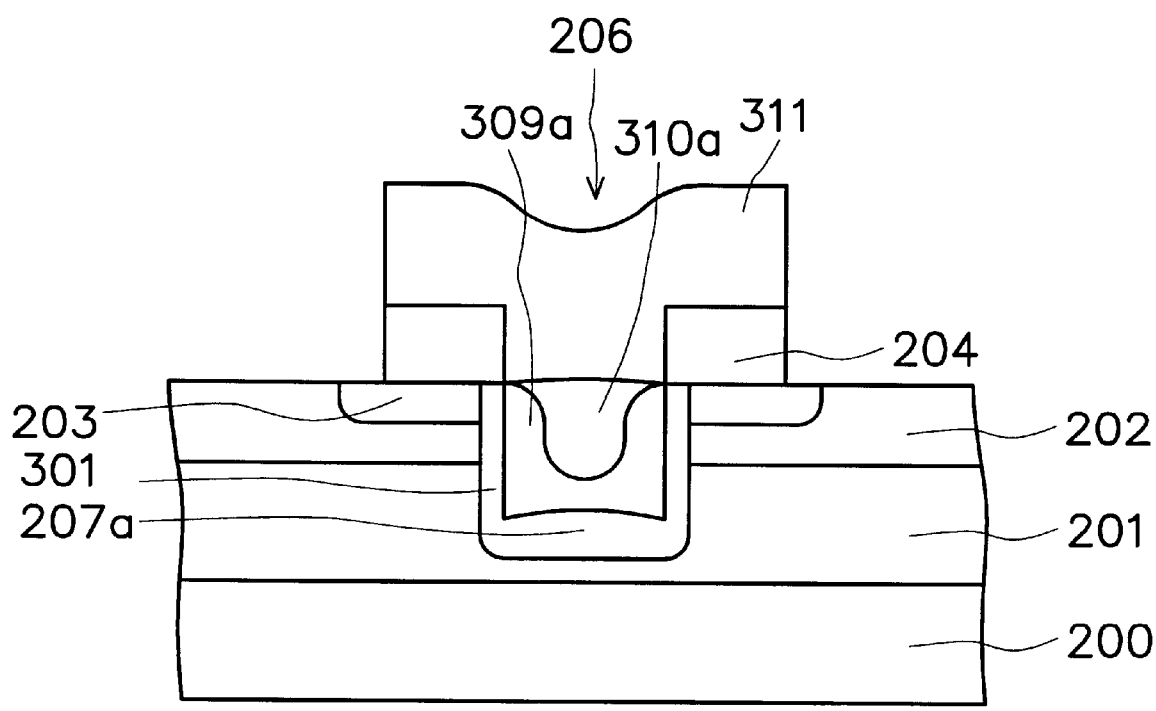

FIGS. 3A through 3C are schematic, cross-sectional views of the process for manufacturing a trench gate structure of a power MOSFET in a second preferred embodiment according to the invention. The power MOFET with a trench gate structure of the second embodiment is based on the wafer structure of FIG. 2C. Elements in FIGS. 3A through 3C that are identical to those in FIG. 2C are labeled with the same numerals.

Referring to FIG. 3A together with FIG. 2C, the dielectric layer 205 (as shown in FIG. 2C) is removed to expose the dielectric layer 204. The method of removing the dielectric layer 205 includes wet etching with heated phosphoric acid, for example. A sacrificial oxide layer (not shown) is grown in the trench 206 and is used to restore the trench 206. The method of forming the sacrificial oxide layer can be thermal oxidation, for example. The sacrificial oxide layer is removed. The method of removing the sacrificial oxide layer can be wet etching, for example. A gate oxide layer 301 is conformally formed in the trench 206. The method of forming the gate oxide layer 301 can be thermal oxidation, for example. A polysilicon layer 309 is conformally formed on the dielectric layer 204 and in the trench 206. The method of forming the polysilicon layer 309 can be LPCVD, for example. A dielectric layer 310 is formed on the polysilicon layer 309 and fills the trench 206. The dielectric layer 310 can be a silicon dioxide layer formed by LPCVD or thermal oxidation, for example.

As shown in FIG. 3B, portions of the dielectric layer 310 and the polysilicon layer 309 are removed to form a polysilicon layer 309a and a dielectric layer 310a. The surfaces of the polysilicon layer 309a and the dielectric layer 310a are substantially level with the surface of the conductive base region 202. The polysilicon layer 309a is on the sidewall and the bottom of the trench 206 and the dielectric layer 310a fills the recess within the polysilicon layer 309a in the trench 206. The method of forming the polysilicon layer 309a and the dielectric layer 310a can be etching back or a method coordinating chemical-mechanical polishing with etching back, for example. The structure composed of the polysilicon layer 309a and the dielectric layer 310a is used as the trench gate structure of the device. A dielectric layer 311 is formed on the dielectric layer 204 and in the trench 206 and fills the trench 206. The dielectric layer 311 can be a BPSG layer formed by LPCVD.

As shown in FIG. 3C, the dielectric layers 311 and 204 are patterned to expose portions of the conductive base region 202 and the conductive source region 203. In the subsequent steps, the conventional processing techniques, which are well known to those skilled in the art, are used to form the base ohmic contact and the wires.

Figure 4A:
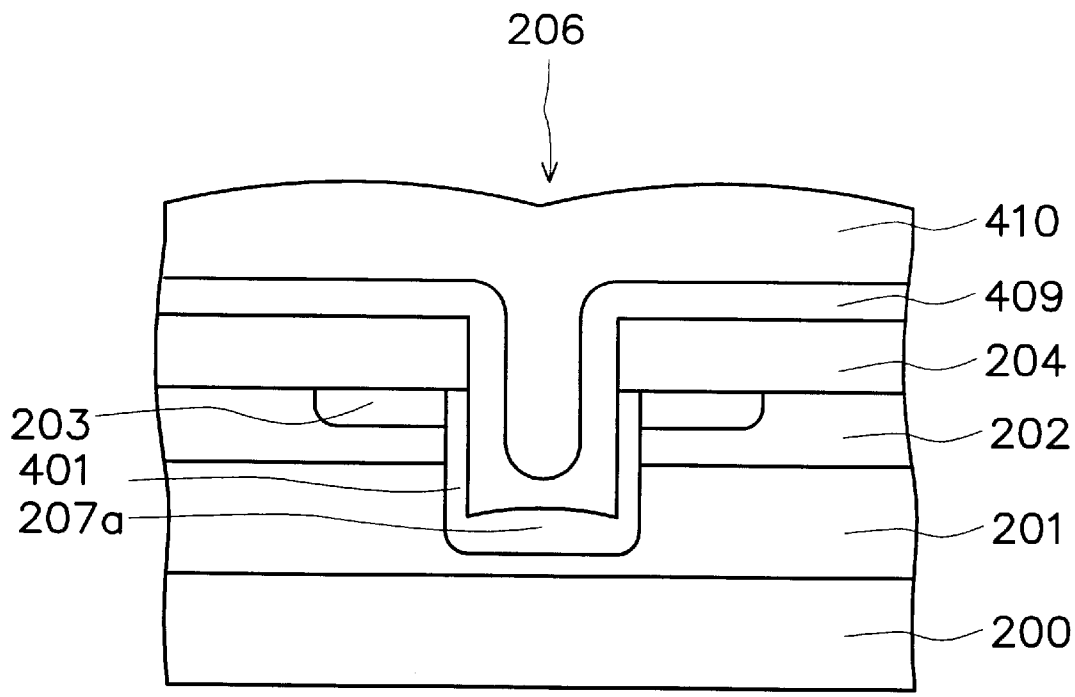
FIGS. 4A through 4C are schematic, cross-sectional views of the process for manufacturing a trench gate structure of a power MOSFET in a third preferred embodiment according to the invention.
Figure 4B:
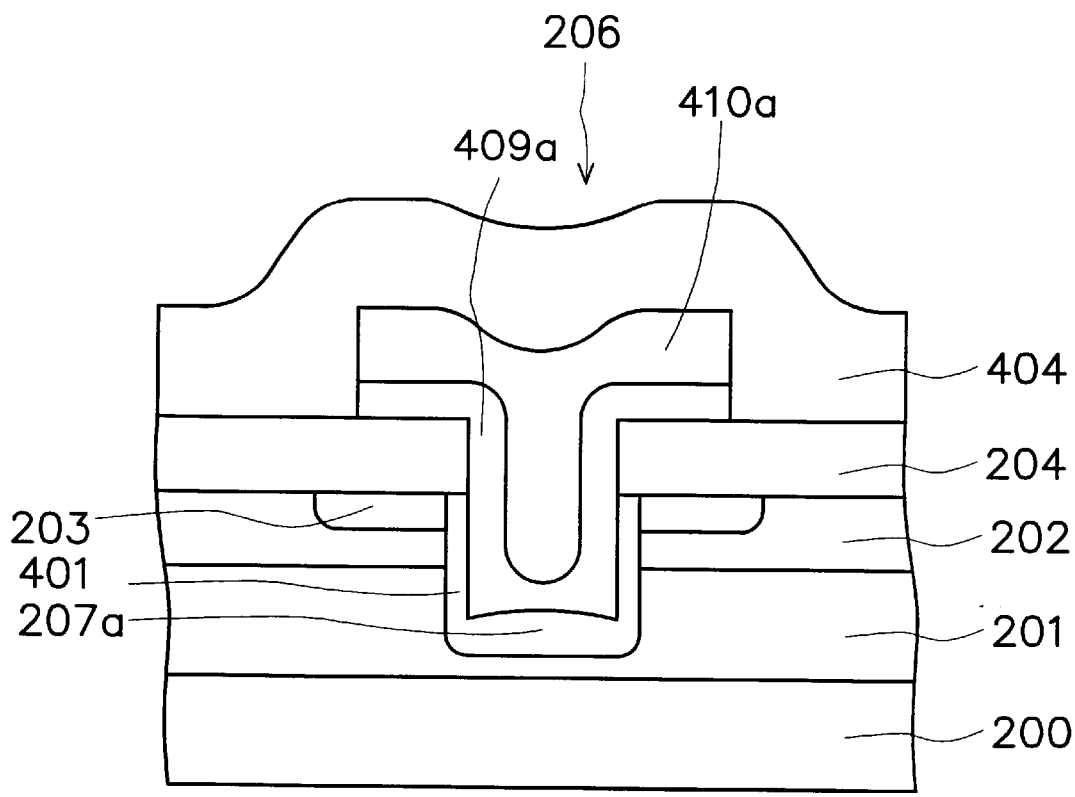
Figure 4C:
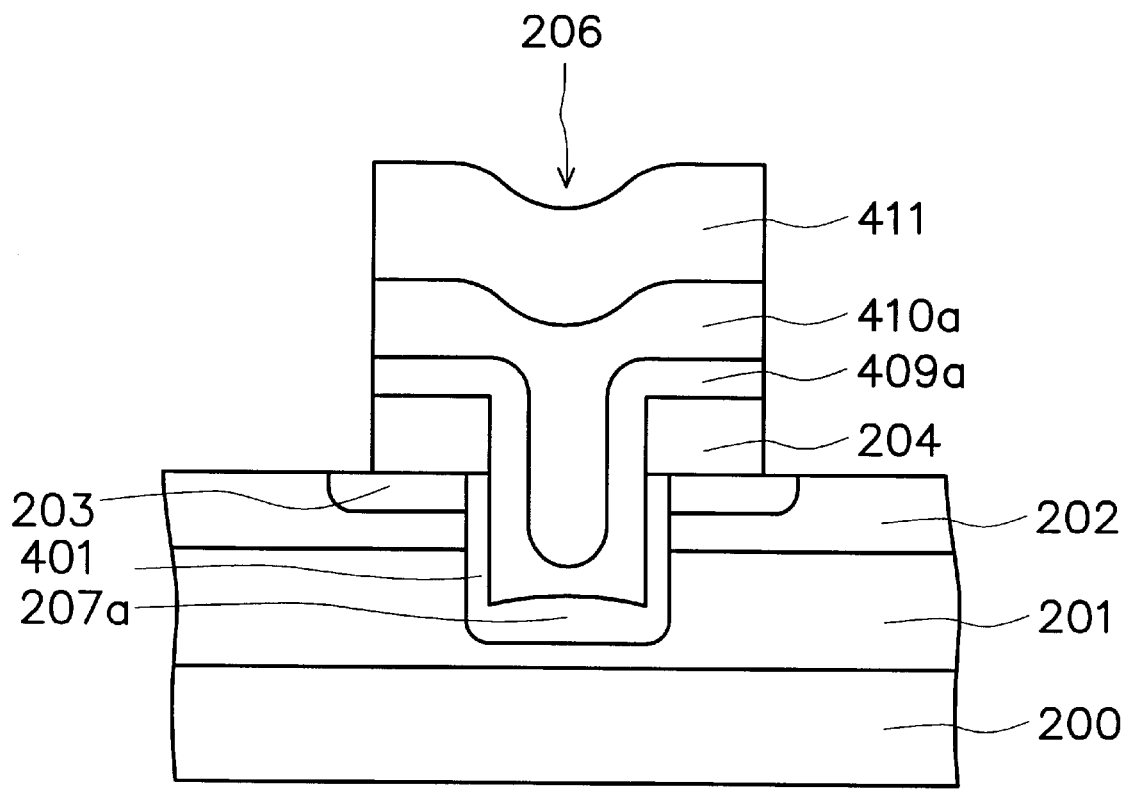

FIGS. 4A through 4C are schematic, cross-sectional views of the process for manufacturing a trench gate structure of a power MOSFET in a third preferred embodiment according to the invention. The power MOFET with a trench gate structure of the third embodiment is based on the wafer structure of FIG. 2C. Elements in FIGS. 4A through 4C that are identical to those in FIG. 2C are labeled with the same numerals.

Referring to FIG. 4A together with FIG. 2C, the dielectric layer 205 (as shown in FIG. 2C) is removed to expose the dielectric layer 204. The method of removing the dielectric layer 205 includes wet etching with heated phosphoric acid, for example. A sacrificial oxide layer (not shown) is grown in the trench 206 and is used to restore the defects of the trench 206. The method of forming the sacrificial oxide layer can be thermal oxidation, for example. The sacrificial oxide layer is removed. The method of removing the sacrificial oxide layer can be wet etching, for example. A gate oxide layer 401 is conformally formed in the trench 206. The method of forming the gate oxide layer 401 can be thermal oxidation, for example. A polysilicon layer 409 is conformally formed on the dielectric layer 204 and in the trench 206. The method of forming the polysilicon layer 409 can be LPCVD, for example. A dielectric layer 410 is formed on the polysilicon layer 409 and fills the trench 206. The dielectric layer 410 can be a silicon dioxide layer formed by LPCVD or thermal oxidation, for example.

As shown in FIG. 4B, the dielectric layer 410 and the polysilicon layer 409 are patterned to form a dielectric layer 410a and a polysilicon layer 409a. Portions of the dielectric layer 410a and a polysilicon layer 409a extending on the dielectric layer 204 are wider than the trench 206. The structure composed by the polysilicon layer 409a and the dielectric layer 410a is used as the trench gate structure of the device. A dielectric layer 411 is formed on the dielectric layers 204 and 410a and the sidewall of the polysilicon layer 409a. The dielectric layer 411 can be a BPSG layer formed by LPCVD.

As shown in FIG. 4C, the dielectric layers 411 and 204 are patterned to expose portions of the conductive base region 202 and the conductive source region 203. In the subsequent steps, conventional processing techniques, which are well known to those skilled in the art, are used to form the base ohmic contact and the wires.

According to the method of the present invention, the thickness of the gate oxide layer on the bottom of the trench is increased by forming a dielectric layer without increasing the thickness of the gate oxide layer on the sidewall of the trench. Hence, the ability of the devices to resist the breakdown voltage is greatly enhanced and the problem of leakage can be overcome. Furthermore, since the thickness of the oxide layer between the gate structure and the base region and between the gate structure and the source region are increased, the capacitances between the gate structure and the base region and between the gate structure and the source region are decreased. Therefore, the switching speed of the device is increased and the loss of the switching power is decreased.

The present invention and the conventional process techniques are compatible; thus the present invention is suitable for the manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a trench gate structure of a power metal-oxide-semiconductor field-effect transistor on a substrate, wherein the substrate has an epitaxial layer thereon, a base region formed in the epitaxial layer, a source region formed in a portion of the base region, a first dielectric layer on the base region and the source region, a second dielectric layer on the first dielectric layer and a trench penetrating through the second and the first dielectric layers, the source region and the base region and into the epitaxial layer, the method comprising the steps of:

forming a third dielectric layer on the bottom of the trench;

forming a conformal gate oxide layer in the trench;

forming a conformal polysilicon layer on the second dielectric layer and in the trench;

forming a fourth dielectric layer on the polysilicon layer to fill the trench; and removing portions of the fourth dielectric layer and the polysilicon layer until surfaces of the fourth dielectric layer and the polysilicon layer are substantially level with the surface of the base region.

2. The method of claim 1, further comprising, after the step of removing portions of the fourth dielectric layer and the polysilicon layer, the steps of:

removing the second dielectric layer; and forming a fifth dielectric layer over the substrate.

3. The method of claim 1, wherein the step of forming the third dielectric layer on the bottom of the trench comprises the steps of:

forming a dielectric layer over the substrate to fill the trench; and removing portions of the dielectric layer to form the third dielectric layer on the bottom of the trench.

4. The method of claim 3, wherein the step of removing the portions of the dielectric layer is performed by dry etching.

5. The method of claim 3, wherein the step of forming the dielectric layer is performed by deposition.

6. The method of claim 1, wherein the third dielectric layer includes a silicon dioxide layer.

7. The method of claim 1, wherein the step of removing portions of the fourth dielectric layer and the polysilicon layer includes etching back.

8. The method of claim 1, wherein the step of removing portions of the fourth dielectric layer and the polysilicon layer includes a method coordinating chemical-mechanical polishing with etching back.

9. A method of manufacturing a trench gate structure of a power metal-oxide-semiconductor field-effect transistor on a substrate, wherein the substrate has an epitaxial layer thereon, a base region formed in the epitaxial layer, a source region formed in a portion of the base region, a first dielectric layer on the base region and the source region, a second dielectric layer on the first dielectric layer and a trench penetrating through the second and the first dielectric layers, the source region and the base region and into the epitaxial layer, the method comprising the steps of:

forming a third dielectric layer on the bottom of the trench;

removing the second dielectric layer;

forming a conformal gate oxide layer in the trench;

forming a conformal polysilicon layer on the first dielectric layer and in the trench;

forming a fourth dielectric layer on the polysilicon layer to fill the trench; and removing portions of the fourth dielectric layer and the polysilicon layer until surfaces of the fourth dielectric layer and the polysilicon layer are substantially level with the surface of the base region.

10. The method of claim 9, further comprising, after the step of removing portions of the fourth dielectric layer and the polysilicon layer, a steps of forming a fifth dielectric layer over the substrate.

11. The method of claim 9, wherein the step of forming the third dielectric layer on the bottom of the trench comprises the steps of:

forming a dielectric layer over the substrate to fill the trench; and removing portions of the dielectric layer to form the third dielectric layer on the bottom of the trench.

12. The method of claim 11, wherein the step of removing the portions of the dieletric layer is performed by dry etching.

13. The method of claim 11, wherein the method of forming the dielectric layer is performed by deposition.

14. The method of claim 9, wherein the third dielectric layer includes a silicon dioxide layer.

15. The method of claim 9, wherein the step of removing portions of the fourth dielectric layer and the polysilicon layer includes etching back.

16. The method of claim 9, wherein the step of removing portions of the fourth dielectric layer and the polysilicon layer includes a method coordinating chemical-mechanical polishing with etching back.

17. A method of manufacturing a trench gate structure of a power metal-oxide-semiconductor field-effect transistor on a substrate, wherein the substrate has an epitaxial layer thereon, a base region formed in the epitaxial layer, a source region formed in a portion of the base region, a first dielectric layer on the base region and the source region, a second dielectric layer on the first dielectric layer and a trench penetrating through the second and the first dielectric layers, the source region and the base region and into the epitaxial layer, the method comprising the steps of:

forming a third dielectric layer on the bottom of the trench;

removing the second dielectric layer;

forming a conformal gate oxide layer in the trench;

forming a conformal polysilicon layer on the first dielectric layer and in the trench;

forming a fourth dielectric layer on the polysilicon layer to fill the trench; and patterning the fourth dielectric layer and the polysilicon layer, wherein remaining portions of the fourth dielectric layer and the polysilicon layer on the first dielectric layer extend beyond an edge of the trench.

18. The method of claim 17, further comprising, after the step of patterning the fourth dielectric layer and the polysilicon layer, a steps of forming a fifth dielectric layer over the substrate.

19. The method of claim 17, wherein the step of forming the third dielectric layer further comprises the steps of:

forming a dielectric layer over the substrate to fill the trench; and removing portions of the dielectric layer to form the third dielectric layer on the bottom of the trench.

20. The method of claim 19, wherein the step of removing the portions of the dielectric layer is performed by dry etching.

21. The method of claim 19, wherein the method of forming the dielectric layer is performed by deposition.

22. The method of claim 17, wherein the third dielectric layer includes a silicon dioxide layer.

23. The method of claim 17, wherein the step of removing portions of the fourth dielectric layer and the polysilicon layer includes etching back.

24. The method of claim 17, wherein the step of removing portions of the fourth dielectric layer and the polysilicon layer includes a method coordinating chemical-mechanical polishing with etching back.

* * * * *